United States Patent
Miller et al.

[11] Patent Number: 6,063,672
[45] Date of Patent: May 16, 2000

[54] NMOS ELECTROSTATIC DISCHARGE PROTECTION DEVICE AND METHOD FOR CMOS INTEGRATED CIRCUIT

[75] Inventors: Gayle Miller; Samuel C. Gioia; Todd A. Randazzo, all of Colorado Springs, Colo.

[73] Assignee: LSI Logic Corporation, Milpitas, Calif.

[21] Appl. No.: 09/245,193

[22] Filed: Feb. 5, 1999

[51] Int. Cl.[7] ............................................. H01L 21/8234
[52] U.S. Cl. ......................... 438/275; 438/281; 438/282
[58] Field of Search ................................. 438/281, 282, 438/275

[56] References Cited

U.S. PATENT DOCUMENTS

| | | |
|---|---|---|
| 4,400,711 | 8/1983 | Avery . |
| 4,470,191 | 9/1984 | Cottrell et al. ............................. 29/576 |
| 4,972,247 | 11/1990 | Patterson et al. . |
| 5,262,344 | 11/1993 | Mistry . |
| 5,416,351 | 5/1995 | Ito et al. ................................... 257/357 |
| 5,440,163 | 8/1995 | Ohhashi ................................... 257/355 |
| 5,504,362 | 4/1996 | Pelella et al. . |
| 5,517,049 | 5/1996 | Huang ..................................... 257/357 |
| 5,535,086 | 7/1996 | Mentzer ..................................... 361/91 |
| 5,545,572 | 8/1996 | Lee et al. . |
| 5,572,394 | 11/1996 | Ker et al. .................................. 361/56 |
| 5,589,415 | 12/1996 | Blanchard . |
| 5,620,920 | 4/1997 | Wilmsmeyer ........................... 438/227 |
| 5,631,793 | 5/1997 | Ker et al. .................................. 361/56 |
| 5,637,900 | 6/1997 | Ker et al. ................................. 257/355 |
| 5,734,186 | 3/1998 | Honnigford et al. .................... 257/360 |
| 5,814,538 | 3/1997 | Kim et al. . |
| 5,814,866 | 3/1996 | Borland . |
| 5,838,033 | 11/1998 | Smooha . |
| 5,841,169 | 11/1998 | Beasom . |
| 5,891,792 | 4/1999 | Shih et al. . |
| 5,907,174 | 5/1996 | Lee et al. . |
| 5,918,127 | 6/1999 | Lee et al. . |
| 5,982,003 | 11/1999 | Hu et al. . |

FOREIGN PATENT DOCUMENTS

| | | |
|---|---|---|
| 58-162067 | 9/1983 | Japan . |
| 2-184802 | 7/1990 | Japan . |
| 5-36909 | 2/1993 | Japan . |

*Primary Examiner*—Richard Booth
*Assistant Examiner*—Jonathan Hack

[57] ABSTRACT

MOS functional devices and electrostatic discharge protection devices are formed on a substrate having a relatively low-resistance area beneath the functional devices to inhibit latch-up of the functional devices and a relatively high resistance area beneath each electrostatic protection device to reduce the snapback holding voltage of each electrostatic discharge protection device.

11 Claims, 2 Drawing Sheets

NMOS ELECTROSTATIC DISCHARGE PROTECTION DEVICE AND METHOD FOR CMOS INTEGRATED CIRCUIT

FIELD OF THE INVENTION

The present invention relates to improvements in electrostatic discharge (ESD) protection devices for complimentary metal-oxide semiconductor (CMOS) integrated circuits (ICs.) More particularly, the present invention relates to a new and improved NMOS ESD protection device with decreased snapback holding voltage performance in an IC having a buried layer implant, and to a new and improved method of fabricating an IC having an ESD protection device and a buried layer implant.

BACKGROUND OF THE INVENTION

Much of the progress in the field of IC technology is associated with CMOS devices. CMOS devices combine NMOS and PMOS (n-channel metal-oxide semiconductors and p-channel metal-oxide semiconductors) transistors to achieve low power consumption and high device densities. These and other beneficial properties associated with CMOS devices have made them the preferred technology in many aspects of integrated circuit design. CMOS designs have, however, been susceptible to two common problems, latch-up caused by parasitic bipolar transistor effects and damage due to electrostatic discharge.

With respect to the latch-up problem, all MOS transistor ICs have pn junctions which can form parasitic bipolar transistors, where the substrate serves as the base, the drain serves as the collector, and the source serves as the emitter. Bipolar transistor action is particularly troublesome in CMOS circuits where the unwanted formation of cross-connected npn and pnp transistors is possible. Above a critical voltage level, a latch-up condition occurs and both bipolar transistors become unwanted amplifiers, causing quickly rising current levels through the transistors. During latch-up, control of the transistors is lost as the amount of current which passes through the MOS transistors is no longer a function of the gate voltage. Furthermore, damage may occur to the MOS transistors if the latch-up current flow is excessive or prolonged.

One way of preventing latch-up is to provide a low-resistance layer below the transistors. Typically the low-resistance layer is achieved by a buried layer implant. Since the substrate below the NMOS and PMOS transistors serves as the base region of the parasitic bipolar transistors, providing a low-resistance substrate makes it difficult to establish a sufficient voltage at the base (substrate) to forward-bias the pn junction between the base (substrate) and the emitter (source). The low resistance decouples the bipolar transistors, decreases the possibility of latch-up, and allows the NMOS and PMOS transistors to function as intended.

A low-resistance epitaxial layer in the substrate of a CMOS will also decouple the parasitic bipolar transistors and thereby improve latch-up performance, in much the same manner as an implanted low-resistance layer. However, the price of epitaxial layer substrates may be prohibitive. A more cost-effective alternative to obtaining similar benefits is to incorporate the low-resistance buried layer implant beneath the CMOS transistors in a bulk silicon substrate.

The second common CMOS problem relates to the high voltages which are present in the device during an ESD event. The pn junctions of the CMOS structure are subject to a number of voltage limitations including avalanche breakdown and punch-through. Punch-through refers to the condition where the drain voltage is increased to the point that the depletion region surrounding the drain region extends to and forward biases the source. The drain current then rises rapidly. Punch-through is generally not destructive, but control over the transistor operating characteristics is no longer possible during punch-through.

Breakdown voltages occur typically when the gate-to-source voltage reaches about 50 volts. At this high voltage level, the gate oxide is destroyed, causing permanent damage to the transistor. While the voltage required to cause breakdown is relatively high, MOS transistors have very high impedance and thus small amounts of static charge accumulated at the gate can cause breakdown voltage conditions to be exceeded. To prevent this type of damage, an ESD protection device is often used to clamp the voltage at the input of the CMOS device to a non-destructive level and to shunt the charge created during the ESD event to ground and away from the other components of the CMOS device.

A common technique of providing ESD protection in CMOS circuits involves utilizing the generally undesirable parasitic bipolar transistor action discussed above to form an ESD protection device. The ESD protection device uses one or more NMOS transistors as bipolar npn transistors with the drain functioning as the collector, the substrate functioning as the base, and the grounded source functioning as the emitter. During ESD conditions, sufficient voltage is developed at the collector (drain) and subsequently at the base (substrate) to forward bias the base and turn on the parasitic bipolar transistors. Current begins to flow through the bipolar transistors and the voltage at the collector (drain) quickly drops and is clamped at a level known as the snapback holding voltage. The collector (drain) is held at the snapback holding voltage and the current associated with the ESD is shunted to ground. The parasitic bipolar transistor continues in a conductive state until the current flow and associated voltage at the base are no longer sufficient to forward bias the base. Ideally, the parasitic bipolar transistors of the ESD protection device should "turn on" quickly and the collector (drain) voltage should be clamped at a level below the transistor breakdown voltage.

One method of increasing the effectiveness of the ESD protection circuit involves increasing the resistance of the substrate below the NMOS transistor. Increased resistance in the substrate allows easier turn-on of the parasitic bipolar transistor action which causes the ESD protection. Ideally, it is desired to have all of the current flow associated with the ESD event discharge through the protection circuit to ground. The disadvantage of a high resistance substrate is that it promotes the occurrence of the latch-up problem described above.

It is often desirable to implement both latch-up immunity and ESD protection in a CMOS device. However, while epitaxial substrates and low resistance buried layer implants serve to decouple the parasitic bipolar transistors, thereby improving latch-up performance in the CMOS device as a whole, they also degrade the ability to use the parasitic bipolar transistors for ESD protection.

It is with respect to this and other background information that the present invention has evolved.

SUMMARY OF THE INVENTION

One of the aspects of the present invention is to achieve improved ESD protection in CMOS ICs which incorporate ESD protection devices, while retaining the benefits of superior latch-up performance associated with the use of a low-resistance buried layer in the CMOS substrate. Another aspect of the invention is to achieve the benefits of improved ESD protection in a CMOS IC, without incurring any of the disadvantages associated with a low-resistance buried layer.

In accordance with these and other aspects, an improved ESD protection device of the present invention comprises a CMOS IC having a number of MOS functional devices and electrostatic discharge protection devices formed on a substrate. The substrate has a relatively low-resistance area beneath the functional devices to inhibit latch-up of the functional devices. The substrate also has a relatively high resistance area beneath each electrostatic protection device to reduce the snapback holding voltage of each electrostatic discharge protection device.

Another aspect of the present invention relates to a method of fabricating a CMOS IC which incorporates ESD protection circuitry, while retaining the benefits of superior latch-up performance associated with the use of a low-resistance buried layer in the CMOS substrate. The method involves the steps of locating a first area on a substrate in which to form the metal oxide semiconductors of the functional devices, locating a second area on a substrate in which to form the metal oxide semiconductors of each electrostatic discharge protection device, and forming a low-resistance layer within the substrate only in the first area and not the second area.

A more complete appreciation of the present invention and its scope can be obtained by reference to the accompanying drawings, which are briefly summarized below, the following detailed description of presently preferred embodiments of the invention, and the appended claims.

DETAILED DESCRIPTION

Figure 1:
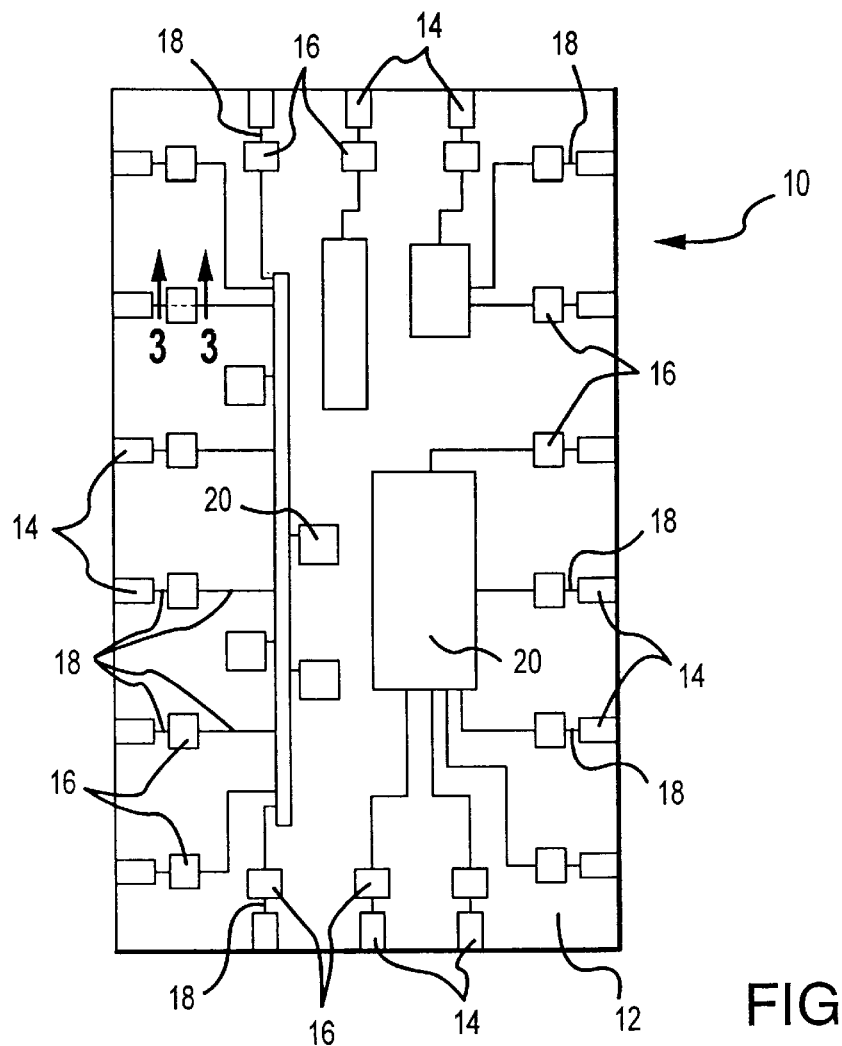
FIG. 1 is a plan view illustration, not necessarily to scale or in proportion, of a typical CMOS IC which incorporates the present invention.

A CMOS device 10 which incorporates the present invention is shown in FIG. 1. Other than the present invention, the CMOS device 10 is conventional. The CMOS device 10 is formed as an integral unit on a die or chip 12. Pads 14 are formed around the exterior periphery of the chip 12 and are connected to the external electrical conductors (not shown) once the chip has been packaged in a standard IC package (also not shown). The pads 14 are connected to the ESD protection devices 16 by internal conductors 18 formed on the chip 12. The ESD protection devices 16 are then connected to typical functional components 20 which contain NMOS and PMOS transistors (not shown).

An ESD protection device 16 is preferably connected to every input pad 14 of the CMOS IC 10. In the event that a static or other unintended high voltage charge is applied to an input pad 14 of the CMOS IC 10, such as during handling of the CMOS IC 10 or from transient conditions during use, the pn junctions between the substrate (bases) and the sources (emitters) of the NMOS transistors of the ESD protection device 16 become forward biased, forming a pair of parasitic bipolar transistors. The current associated with the static or high voltage charge is then shunted away from the functional components 20 through the parasitic bipolar transistors of the ESD protection device 16.

Figure 2:
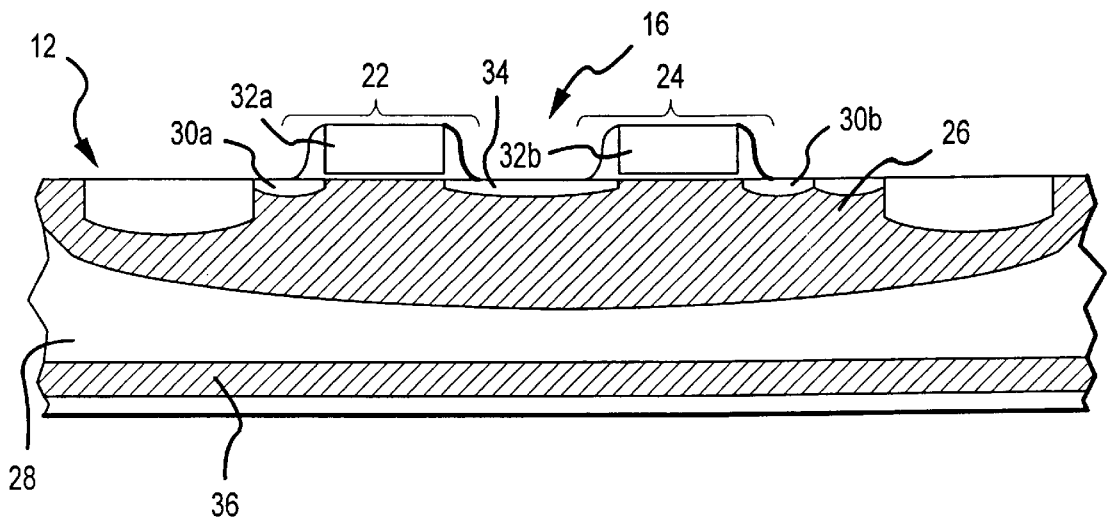
FIG. 2 is a partial vertical cross-sectional view of a typical prior art NMOS transistor used as an ESD protection device formed on a silicon substrate in a CMOS IC.

Details of a conventional prior art ESD protection device are shown in FIG. 2. The ESD protection device 16 is formed by parallel NMOS transistors 22 and 24 located on the chip 12. The NMOS transistors 22 and 24 are fabricated in a P-well 26 which is formed in an N-substrate 28. The transistors 22 and 24 include sources 30a and 30b and gates 32a and 32b, respectively, as well as a common drain 34. Also shown in FIG. 2 is a buried layer implant 36 which forms a low current, low resistance path within the substrate 28.

In a typical CMOS IC the buried layer implant 36 extends throughout the entire substrate 28 of the CMOS IC below all active devices and components, including the ESD protection devices 16. A low-resistance buried layer implant 36 inhibits the formation of parasitic bipolar transistors in all NMOS and PMOS transistors in all of the components of the CMOS device. The buried layer implant 36 reduces the occurrence of latch-up within the device but, as the present invention recognizes, also inhibits the desired formation of parasitic bipolar transistors within the ESD protection device.

Figure 3:
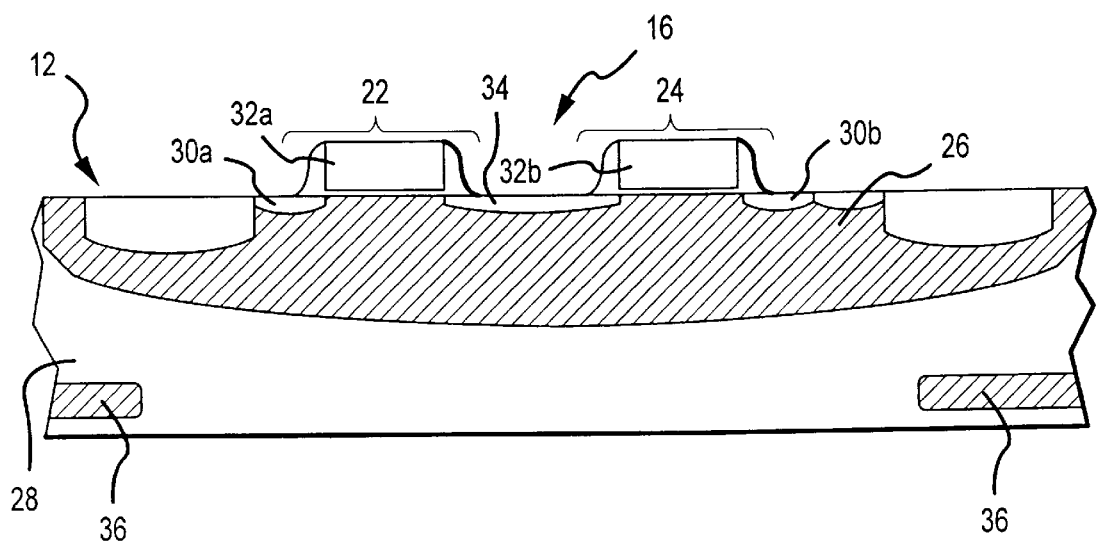
FIG. 3 is a partial vertical cross-sectional view of an NMOS transistor used as an ESD protection device in the IC shown in FIG. 1, taken in the plane of line 3—3.

In accordance with features of the present invention, as shown in FIG. 3, the buried layer implant 36 is absent beneath the ESD protection device 16. The absence of the buried layer implant 36 beneath the ESD protection device 16 creates a relatively high resistance in the substrate 28 under the P-well 26 beneath the parallel transistors 22 and 24. A sufficiently high resistance in the substrate 28 below the NMOS transistors 22 and 24 allows the pn junctions of the transistors 22 and 24 to become forward biased and parasitic bipolar transistors to be turned on more easily. The parasitic bipolar transistors then clamp the voltage at the drain 34 to a level below the breakdown voltage and shunt excess current away from the functional components 20 to ground. With higher resistance in the substrate 28, less current is required to forward bias the parasitic bipolar transistors, and consequently the bipolar transistors turn on at a lower snapback voltage. Consequently, the absence of the buried layer 36 below the transistors 22 and 24 of the ESD protection device 16 achieves more effective protection by the ESD protection device 16.

Figure 4:
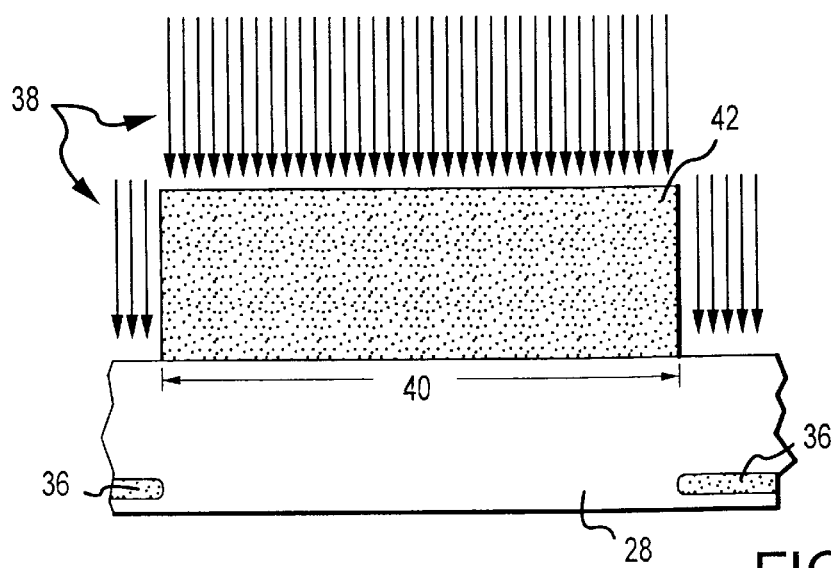
FIG. 4 is a cross-sectional view of the IC shown in FIG. 1 during a fabrication step in which a buried layer is formed in locations other than those locations where ESD protection devices are to be formed.

FIG. 4 shows steps in forming the buried layer implant 36 within the substrate 28 of the CMOS IC 10, but not in an area 40 beneath each ESD protection device (not shown in FIG. 4). First, the area 40 on the substrate 28 upon which the ESD protection device will be formed is covered with a relatively thick layer of photoresist. (Not shown). The layer of photoresist is then patterned with typical photolithographic techniques and etched, leaving a mask 42. The mask 42 and the layer of photoresist from which it was patterned must have physical properties sufficient to completely block the implant ions of the beam 38 (typically boron ions) from reaching the substrate 28 and from becoming implanted in the areas where the ESD protection devices will be formed. In many cases, a mask of approximately 6 micrometers is considered sufficient for blocking purposes.

The buried layer 36 is then formed by subjecting the entire substrate 28, including those areas 40 covered by the mask 42, to a high energy ion implantation beam 38. The ion beam 38 implants a layer of ions throughout the substrate 28, creating a low resistance conductive region 36 everywhere except in those areas 40 covered by the mask 42. The mask 42 is then removed and ESD protection devices are formed on the substrate 28 in those areas 40 formerly covered by the mask. The depth of the buried layer 36, as well as the concentration of the ions within the buried layer 36, is a function of the method and energy of the beam 38 used to implant the ions.

Utilizing the ion beam masking method of the present invention allows for the manufacture of a CMOS devices that simultaneously achieve improved latch-up performance and a lower snap-back voltage in the ESD protection device.

Presently preferred embodiments of the invention and its improvements have been described with a degree of particularity. This description has been made by way of preferred example. It should be understood that the scope of the present invention is defined by the following claims, and should not be unnecessarily limited by the detailed description of the preferred embodiment set forth above.

The invention claimed is:

1. A method of fabricating an integrated circuit having metal oxide semiconductors used as functional devices and used as at least one electrostatic discharge protection device, comprising the steps of:

locating a first area on a substrate in which to form the metal oxide semiconductors of the functional devices and a second area on a substrate in which to form the metal oxide semiconductors of each electrostatic discharge protection device; and forming a low-resistance layer beneath the upper surface of the substrate only in the first area and not the second area.

2. A method as defined in claim 1 further comprising the steps of:

forming the metal oxide semiconductors of the functional devices in the first area; and forming the metal oxide semiconductors of each electrostatic discharge protection device in the second area.

3. A method as defined in claim 1 wherein the step of forming a low-resistance layer within the substrate only in the first area and not the second area further comprises the steps of:

applying a layer of masking material to the second area on the substrate;

implanting an ion-doped layer beneath the surface of the substrate; and removing the masking material from the second area on the substrate.

4. A method as defined in claim 3 wherein the step of implanting an ion doped layer further comprises the step of:

driving the ions into the substrate with a high energy beam to a depth determined by the level of energy of the high energy beam.

5. A method as defined in claim 3 further comprising the step of:

doping the ion doped layer with boron ions.

6. A method as defined in claim 3 further comprising the step of:

adjusting the depth of the masking material to a sufficient depth to prevent a beam of ions from penetrating the masking material.

7. A method as defined in claim 1 wherein the step of forming the metal oxide semiconductors of each electrostatic discharge protection device further comprises the step of:

forming the metal oxide semiconductors as parallel NMOS transistors.

8. A method of fabricating on a substrate an integrated circuit having metal oxide semiconductors used as functional devices and used as at least one electrostatic discharge protection device, comprising the steps of:

creating a relatively low resistance area of the substrate;

fabricating the metal oxide semiconductors of the functional devices at the relatively low resistance area;

creating a relatively high resistance area of the substrate at a location other than at the low resistance area; and fabricating the metal oxide semiconductors of each electrostatic discharge protection device at the relatively high resistance area.

9. A method of preparing a substrate upon which to fabricate an integrated circuit having metal oxide semiconductors used as functional devices and used as at least one electrostatic discharge protection device, comprising the steps of:

creating a relatively low resistance area of the substrate for fabrication of the metal oxide semiconductors of the functional devices;

creating a relatively high resistance area of the substrate for fabrication of the metal oxide semiconductors of each electrostatic discharge protection device; and forming the relatively low resistance area as a buried layer beneath an upper surface of the substrate at a location on the substrate where the metal oxide semiconductors of the functional devices are formed.

10. A method as defined in claim 9 further comprising the step of:

forming the relatively low resistance area by implanting ions in the substrate.

11. A method as defined in claim 10 wherein the step of implanting ions in the substrate further comprises the step of:

driving the ions into the substrate with a high energy beam of ions to a predetermined depth by controlling the level of energy of the high energy beam.

* * * * *